(12) United States Patent
Kubota

(10) Patent No.: US 11,502,048 B2
(45) Date of Patent: Nov. 15, 2022

(54) SEMICONDUCTOR APPARATUS

(71) Applicant: SHINKO ELECTRIC INDUSTRIES CO., LTD., Nagano (JP)

(72) Inventor: Kazuyuki Kubota, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 294 days.

(21) Appl. No.: 15/931,913

(22) Filed: May 14, 2020

(65) Prior Publication Data
US 2020/0373258 A1 Nov. 26, 2020

(30) Foreign Application Priority Data

May 24, 2019 (JP) .............................. JP2019-097558

(51) Int. Cl.
*H01Q 1/32* (2006.01)
*H01L 23/66* (2006.01)
*H04B 17/10* (2015.01)

(52) U.S. Cl.
CPC .......... *H01L 23/66* (2013.01); *H04B 17/102* (2015.01); *H01L 2223/6677* (2013.01)

(58) Field of Classification Search
CPC . H01L 23/66; H01L 2223/6677; H01L 22/14; H01L 22/20; H01L 2224/73204; H01L 2924/014; H01L 2924/15311; H01L 2924/15331; H04B 17/102; H04B 17/101; H04B 17/12; H01Q 1/2283
See application file for complete search history.

(56) References Cited

U.S. PATENT DOCUMENTS

| | | | |
|---|---|---|---|
| 8,125,792 B2 | 2/2012 | Kawabata | |
| 2019/0181126 A1* | 6/2019 | Cheah | .................. H01Q 21/061 |
| 2019/0207310 A1* | 7/2019 | Gu | .......................... H01Q 13/16 |

FOREIGN PATENT DOCUMENTS

JP 2009-141228 6/2009

* cited by examiner

*Primary Examiner* — Graham P Smith
(74) *Attorney, Agent, or Firm* — IPUSA, PLLC

(57) ABSTRACT

A semiconductor apparatus includes an interconnect substrate which includes an antenna module region in which an antenna and a semiconductor integrated circuit electrically connected to the antenna are disposed, and at least one evaluation region situated next to the antenna module region and used to evaluate characteristics of the antenna, wherein the at least one evaluation region has at least one slit formed therein such that the slit includes at least a portion, situated opposite the antenna, of a boundary line that separates the antenna module region and the evaluation region from each other.

8 Claims, 6 Drawing Sheets

SEMICONDUCTOR APPARATUS

CROSS-REFERENCE TO RELATED APPLICATIONS

The present application is based on and claims priority to Japanese patent application No. 2019-097558 filed on May 24, 2019, with the Japanese Patent Office, the entire contents of which are hereby incorporated by reference.

FIELD

The disclosures herein relate to a semiconductor device.

BACKGROUND

Some type of semiconductor apparatuses, as known in the art, have an antenna module in which a semiconductor integrated circuit, an antenna, a matching circuit, and the like are mounted on an interconnect substrate. There may be a case, for such a semiconductor apparatus, in which characteristics evaluation needs to be performed to access the matching characteristics of an antenna, for example. To this end, the interconnect substrate is provided with an evaluation region in addition to an antenna module region which will become a finished product. Characteristics evaluation is performed by use of evaluation-purpose terminals and circuits provided in the evaluation region. The evaluation region is removed in the end, and the antenna module region alone will be used as the product.

Provision of an evaluation region in addition to an antenna module region causes the physical property values (dielectric constant, dielectric loss tangent, and the like) of the evaluation region to affect the antenna module region. As a result, characteristics existing prior to the removal of an evaluation region and characteristics existing after the removal of the evaluation region are not in agreement with each other. This makes it impossible to perform, prior to the removal of the evaluation region, proper characteristics evaluation with respect to the antenna module region, which will become a finished product.

Accordingly, there may be a need, with respect to a semiconductor apparatus having an evaluation region in addition to a region that will become a finished product, to perform, prior to the removal of the evaluation region, proper characteristics evaluation with respect to the region that will become a finished product.

[Patent Document 1] Japanese Laid-open Patent Publication No. 2009-141228

SUMMARY

It is a general object of the present invention to provide a semiconductor apparatus that substantially obviates one or more problems caused by the limitations and disadvantages of the related art.

According to an embodiment, a semiconductor apparatus includes an interconnect substrate which includes an antenna module region in which an antenna and a semiconductor integrated circuit electrically connected to the antenna are disposed, and at least one evaluation region situated next to the antenna module region and used to evaluate characteristics of the antenna, wherein the at least one evaluation region has at least one slit formed therein such that the slit includes at least a portion, situated opposite the antenna, of a boundary line that separates the antenna module region and the evaluation region from each other.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described by referring to the accompanying drawings. In these drawings, the same elements are referred to by the same references, and a duplicate description thereof may be omitted.

First Embodiment

Figure 1:
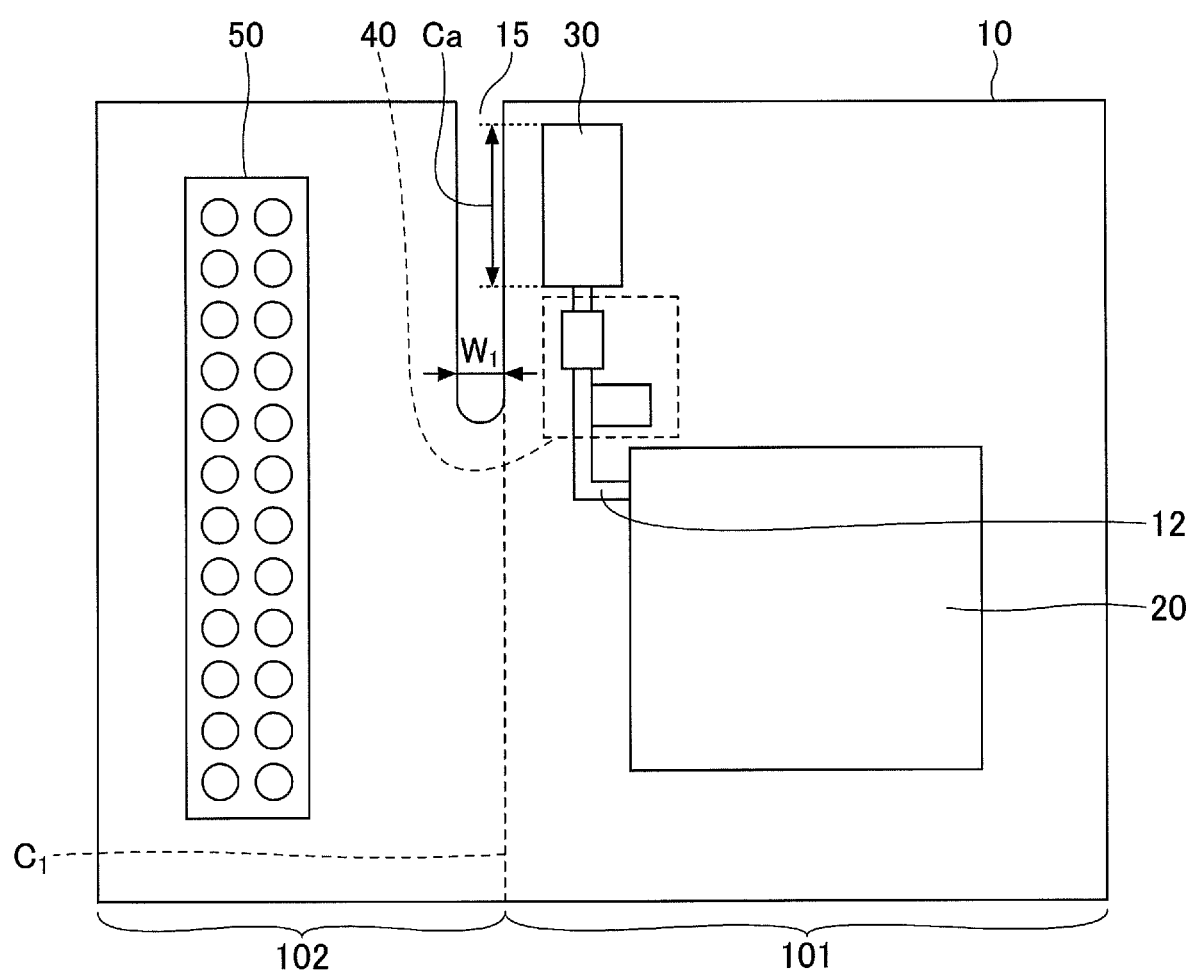
FIG. 1 is a plan view illustrating an example of a semiconductor apparatus according to a first embodiment.

FIG. 1 is a plan view illustrating an example of a semiconductor apparatus according to a first embodiment; With reference to FIG. 1, a semiconductor apparatus 1 has an interconnect substrate 10 that includes an antenna module region 101 and an evaluation region 102. The interconnect substrate 10 is a general-purpose substrate such as a glass-epoxy substrate, for example.

The antenna module region 101 has a semiconductor integrated circuit 20, an antenna 30, and a matching circuit 40 disposed therein. The semiconductor integrated circuit 20 may be an RFIC (i.e., radio frequency integrated circuit) connected to the antenna 30 and to the matching circuit 40 through an interconnect pattern 12 to process radio-frequency signals.

The evaluation region 102, which is provided next to the antenna module region 101, is used to evaluate the characteristics of the antenna 30. Evaluation terminals 50 are disposed in the evaluation region 102. The evaluation terminals 50 are electrically connected to the semiconductor integrated circuit 20 through interconnect patterns (not shown). An evaluation circuit, which may be connected to the evaluation terminals 50 and to the semiconductor integrated circuit 20, may be mounted in the evaluation region 102 according to need.

The evaluation terminals 50 serve as input/output terminals connected to a controller such as a PC (personal computer) or the like when evaluating the matching characteristics or the like of the semiconductor apparatus 1. The evaluation terminals 50 are used in characteristics evaluation performed when the semiconductor apparatus 1 is completed on the manufacturing line, or are used in prototype evaluation for examining the matching characteristics of the semiconductor apparatus 1.

A boundary line $C_1$ is an imaginary line separating the antenna module region 101 from the evaluation region 102, and serves as a dicing line along which the evaluation region 102 is separated from the interconnect substrate 10. The semiconductor apparatus 1 having the configuration illustrated in FIG. 1 is shipped from the factory. The interconnect substrate 10 is then cut along the boundary line $C_1$ to remove the evaluation region 102 from the interconnect substrate 10, thereby allowing only the antenna module region 101 to be included in the finished product.

The interconnect substrate 10 has a slit 15 formed therein. The slit 15 is not formed inside the antenna module region 101, and is formed inside the evaluation region 102 alongside, and in contact with, the antenna module region 101. Specifically, the slit 15 is formed in the evaluation region 102 such that the slit 15 includes at least the portion of the boundary line $C_1$ which is situated opposite the antenna 30. Notwithstanding this, the slit 15 may be formed to extend to both the antenna module region 101 and the evaluation region 102.

The portion of the boundary line $C_1$ that is situated opposite the antenna 30 is such a portion from which a line normal to the boundary line $C_1$ extends to intersect any portion of the antenna 30.

In the example illustrated in FIG. 1, the range indicated as Ca is the portion of the boundary line $C_1$ situated opposite the antenna 30. The slit 15 is formed in the evaluation region 102 such that the slit 15 includes at least the range indicated as Ca. The same applies in the case in which the antenna 30 is not provided parallel to the boundary line $C_1$ or when the antenna 30 has an irregular shape. In this manner, the slit 15 has such a length that the slit 15 includes at least a portion, situated opposite the antenna 30, of the boundary line $C_1$ that separates the antenna module region 101 from the evaluation region 102.

The interior of the slit 15 is air, so that relatively adequate physical property values (dielectric constant, dielectric loss tangent, etc.) are obtained compared with when the interconnect substrate 10 is present at the position of the slit 15. The dielectric constant and dielectric loss tangent of air is 1 and 0, respectively. These values are lower and better than the dielectric constant and dielectric loss tangent of the interconnect substrate 10. Accordingly, provision of the slit 15 serves to reduce the effect of the physical property values of the evaluation region 102 on the antenna 30, thereby enabling the provision of satisfactory matching characteristics.

Figure 2:
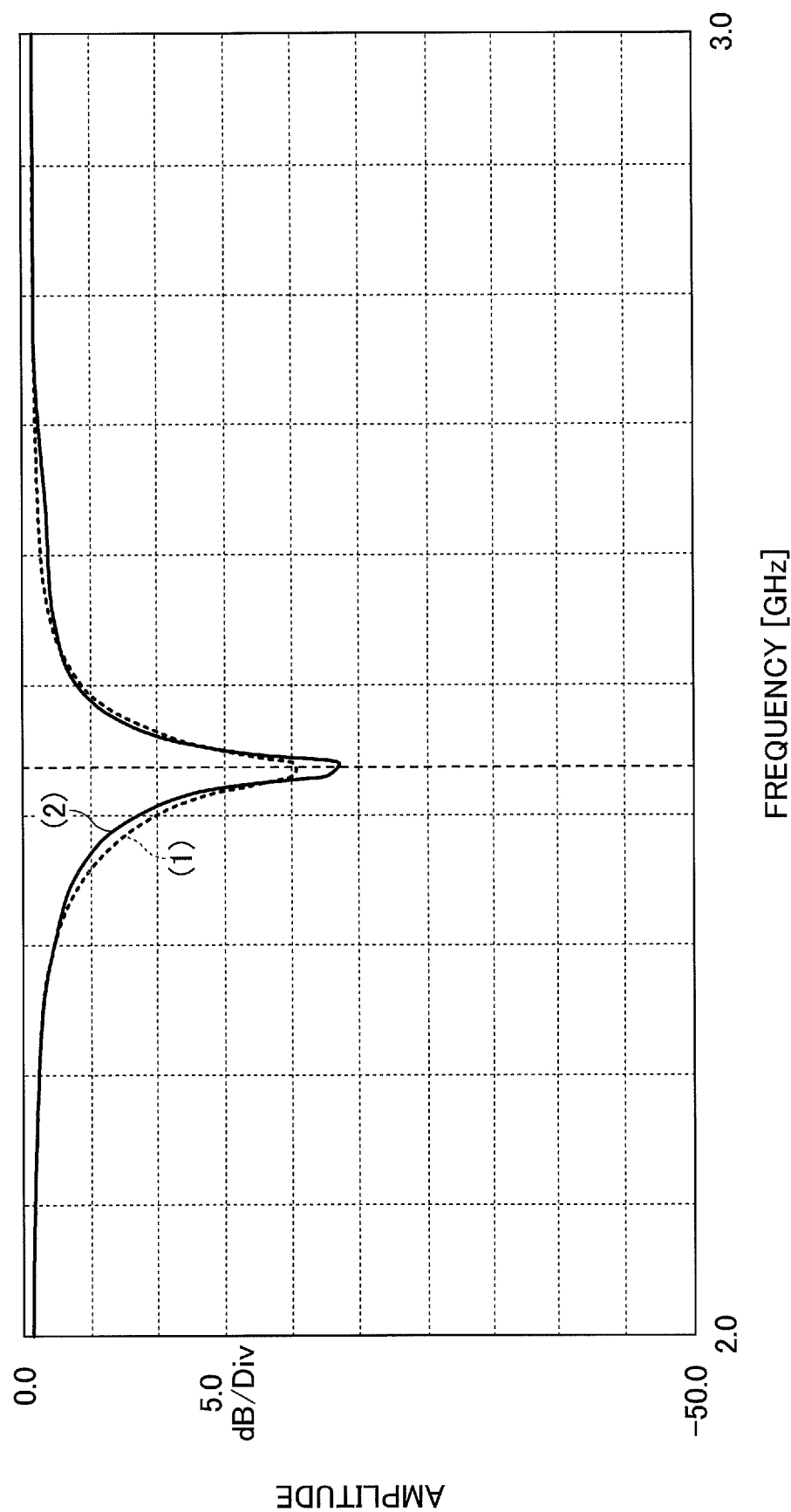
FIG. 2 is a drawing illustrating an example of the matching characteristics of the semiconductor apparatus of the first embodiment.

FIG. 2 is a drawing illustrating an example of the matching characteristics of the semiconductor apparatus of the first embodiment. In FIG. 2, a curved line (1) shows the matching characteristics of the semiconductor apparatus 1 illustrated in FIG. 1, and a curved line (2) shows the matching characteristics of the antenna module region 101 alone which remains after removing the evaluation region 102 from the configuration illustrated in FIG. 1. In FIG. 2, the matching characteristics (1) and the matching characteristics (2) are substantially in agreement with each other, which indicates that the semiconductor apparatus 1, as it is, can be used to provide correct evaluation of the matching characteristic of the antenna module region 101 alone.

The slit 15 is preferably longer than the range indicated by Ca. The width $W_1$ of the slit 15 is preferably greater than or equal to 2 mm. Satisfying these conditions allows the matching characteristics (1) and (2) shown in FIG. 2 to coincide with sufficient accuracy.

Figure 3:
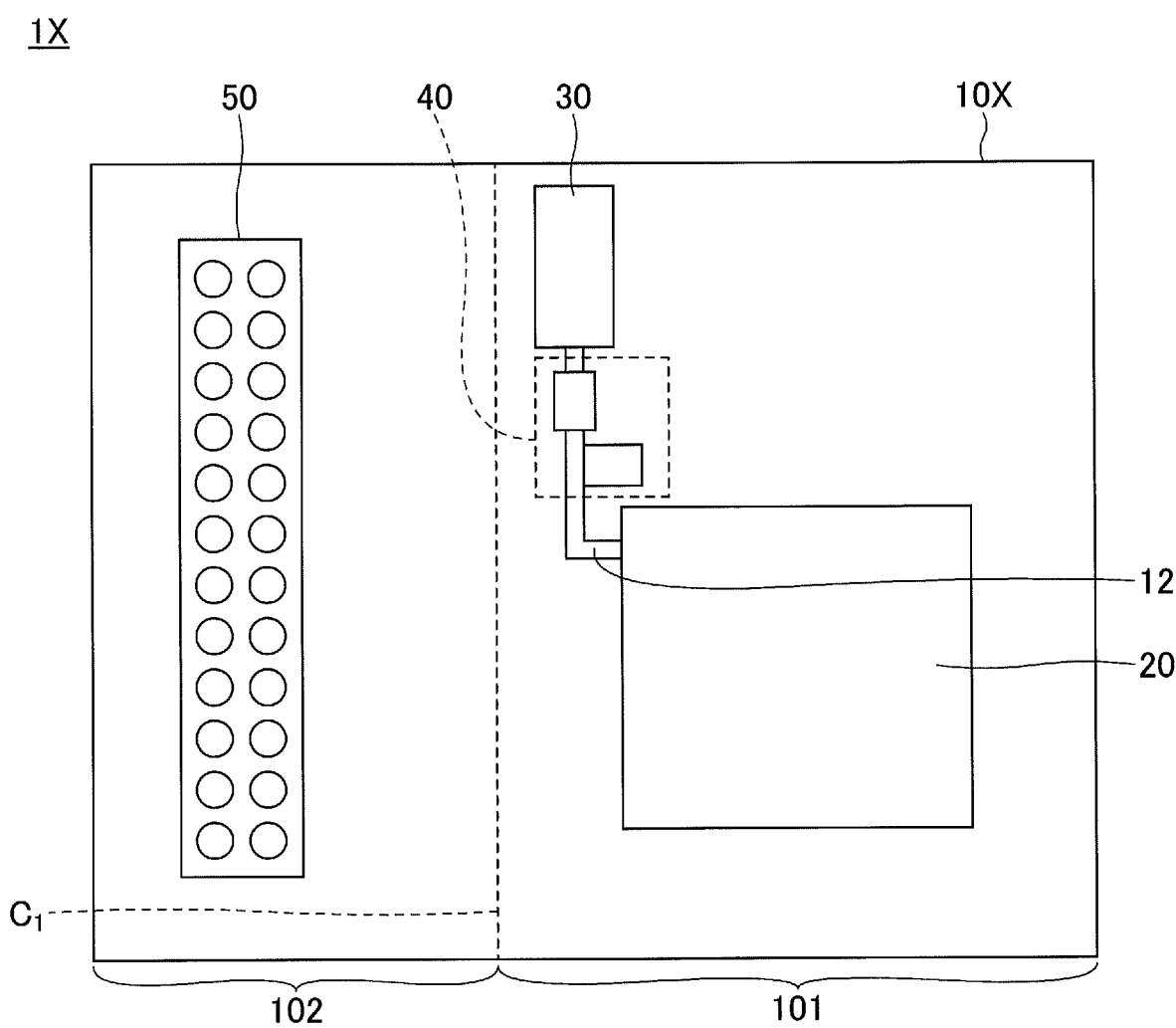
FIG. 3 is a plan view illustrating an example of a semiconductor apparatus of a comparative example.

FIG. 3 is a plan view illustrating an example of a semiconductor apparatus of a comparative example. In FIG. 3, a semiconductor apparatus 1X differs from the semiconductor apparatus 1 (see FIG. 1) in that no slit is formed in an interconnect substrate 10X.

Figure 4:
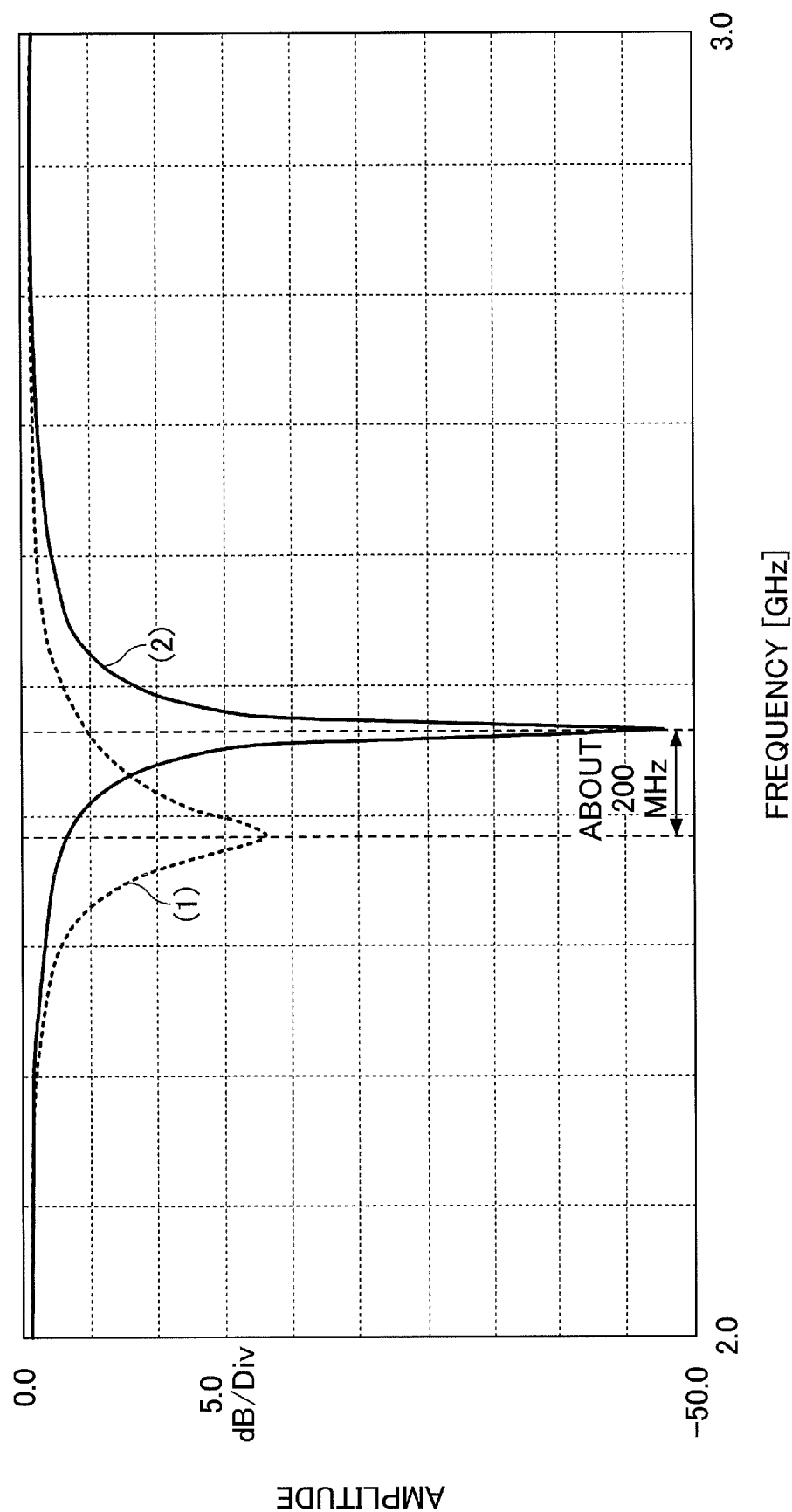
FIG. 4 is a drawing illustrating an example of the matching characteristics of the semiconductor apparatus of the comparative example.

FIG. 4 is a drawing illustrating an example of the matching characteristics of the semiconductor apparatus of the comparative example. In FIG. 4, a curved line (1) shows the matching characteristics of the semiconductor apparatus 1X illustrated in FIG. 3, and a curved line (2) shows the matching characteristics of the antenna module region 101 alone which remains after removing the evaluation region 102 from the configuration illustrated in FIG. 3. In FIG. 4, the matching characteristics (1) and the matching characteristics (2) are not in agreement with each other, with an approximately 200-MHz difference in the resonant frequency.

The semiconductor apparatus 1X has no slit in the interconnect substrate 10X, so that the physical property values of the evaluation region 102 affect the antenna module region 101, resulting in the difference in the matching characteristics as illustrated in FIG. 4. As illustrated in FIG. 4, the matching characteristics existing prior to the removal of the evaluation region 102 and the matching characteristics existing after the removal of the evaluation region 102 are not in agreement with each other. This makes it impossible to perform, prior to the removal of the evaluation region 102, proper evaluation of matching characteristics with respect to the antenna module region 101.

In contrast, the semiconductor apparatus 1 has the slit 15 in the interconnect substrate 10, so that the matching characteristics of the antenna module region 101 can be properly evaluated prior to the removal of the evaluation region 102 as was previously described.

First Variation of First Embodiment

The first variation of the first embodiment is directed to an example of the semiconductor apparatus that has an evaluation region having a different shape from that of the first embodiment. In connection with the first variation of the first embodiment, a description of the same or similar constituent elements as those of the previously provided descriptions may be omitted as appropriate.

Figure 5:
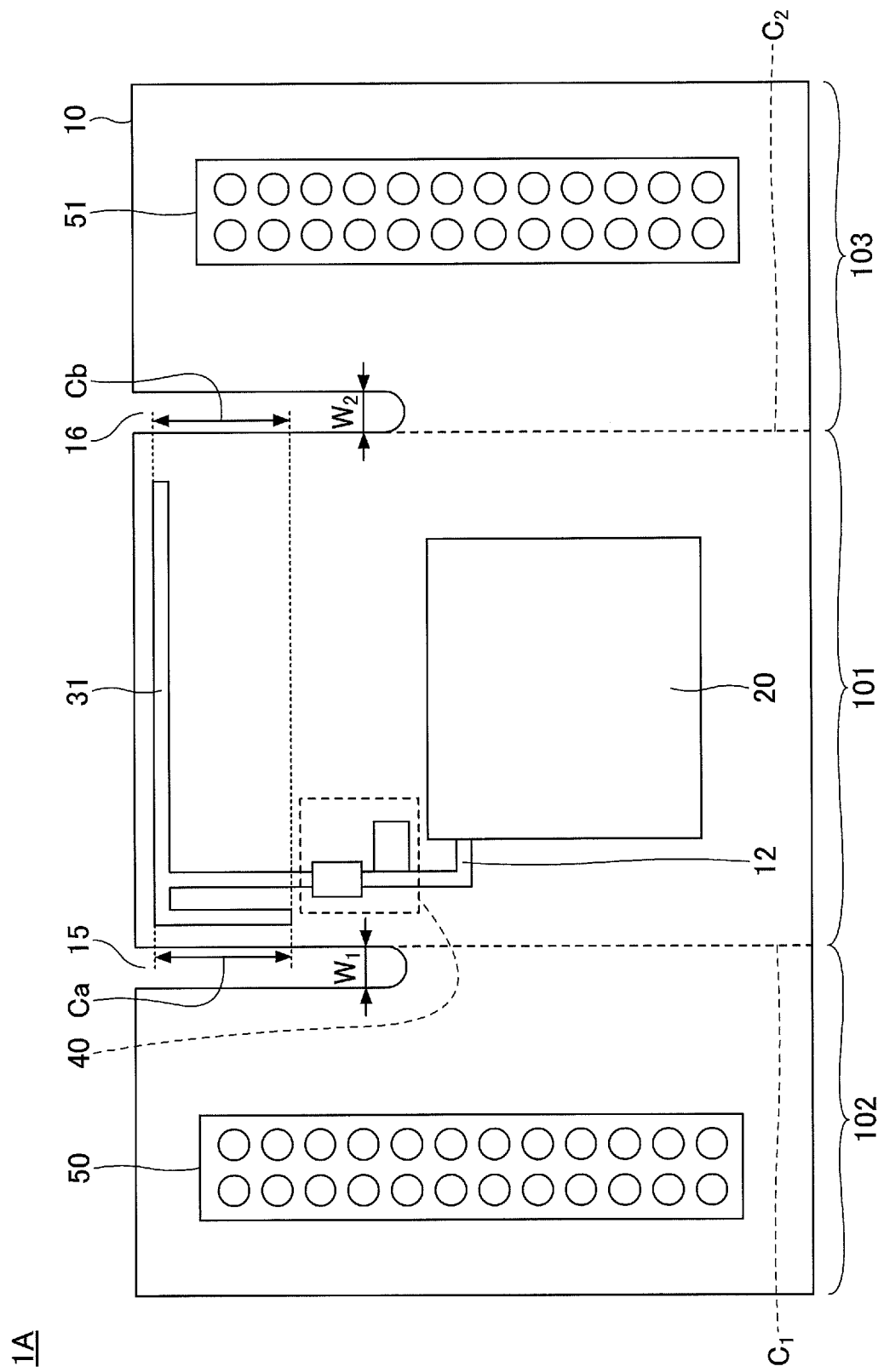
FIG. 5 is a plan view illustrating an example of a semiconductor apparatus according to a first variation of the first embodiment.

FIG. 5 is a plan view illustrating an example of a semiconductor apparatus according to a first variation of the first embodiment. In FIG. 5, a semiconductor apparatus 1A differs from the semiconductor apparatus 1 (see FIG. 1) in that the interconnect substrate 10 has evaluation regions 102 and 103 situated opposite each other across the antenna module region 101.

The evaluation region 103, which is provided next to the antenna module region 101, is used to evaluate the characteristics of the antenna 31. Evaluation terminals 51 are disposed in the evaluation region 103. The evaluation terminals 51 are electrically connected to the semiconductor integrated circuit 20 through interconnect patterns (not shown). An evaluation circuit, which may be connected to the evaluation terminals 51 and to the semiconductor integrated circuit 20, may be mounted in the evaluation region 103 according to need.

The evaluation terminals 51, together with the evaluation terminals 50, serve as input/output terminals connected to a controller such as a PC or the like when evaluating the matching characteristics or the like of the semiconductor apparatus 1. The evaluation terminals 50 and 51 are used in characteristics evaluation performed when the semiconductor apparatus 1A is completed on the manufacturing line, or are used in prototype evaluation for examining the matching characteristics of the semiconductor apparatus 1A.

A boundary line $C_2$ is an imaginary line separating the antenna module region 101 from the evaluation region 103, and serves as a dicing line along which the evaluation region 103 is separated from the interconnect substrate 10. The semiconductor apparatus 1A having the configuration illustrated in FIG. 5 is shipped from the factory. The interconnect substrate 10 is then cut along the boundary lines $C_1$ and $C_2$ to remove the evaluation regions 102 and 103 from the interconnect substrate 10, thereby allowing only the antenna module region 101 to be included in the finished product.

The interconnect substrate 10 has slits 15 and 16 formed therein. The slit 15 is substantially the same as in the case of the semiconductor apparatus 1. The slit 16 is not formed inside the antenna module region 101, and is formed inside the evaluation region 103 alongside, and in contact with, the antenna module region 101. Specifically, the slit 16 is formed in the evaluation region 103 such that the slit 16 includes at least the portion of the boundary line $C_2$ which is situated opposite the antenna 31. Notwithstanding this, the slit 16 may be formed to extend to both the antenna module region 101 and the evaluation region 103.

In the example illustrated in FIG. 5, the range indicated as Cb is the portion of the boundary line C2 situated opposite the antenna 31. The slit 16 is formed in the evaluation region 103 such that the slit 15 includes at least the range indicated as Cb. The slit 16 is preferably longer than the range indicated by Cb. In this manner, the slit 16 has such a length that the slit 15 includes at least a portion, situated opposite the antenna 31, of the boundary line $C_2$ that separates the antenna module region 101 from the evaluation region 103.

The width W2 of the slit 16 is preferably greater than or equal to 2 mm. Satisfying these conditions allows the matching characteristics existing before and after the removal of the evaluation region 103 to coincide with sufficient accuracy.

When the antenna 31 is situated closer to one of the evaluation regions 102 and 103, and the antenna 31 is thus affected only by the physical property values of the closer one of the evaluation regions 102 and 103, a slit may be provided only in the evaluation region that has such affecting physical property values.

Second Variation of First Embodiment

The second variation of the first embodiment is directed to another example of the semiconductor apparatus that has an evaluation region having a different shape from that of the first embodiment. In connection with the second variation of the first embodiment, a description of the same or similar constituent elements as those of the previously provided descriptions may be omitted as appropriate.

Figure 6:
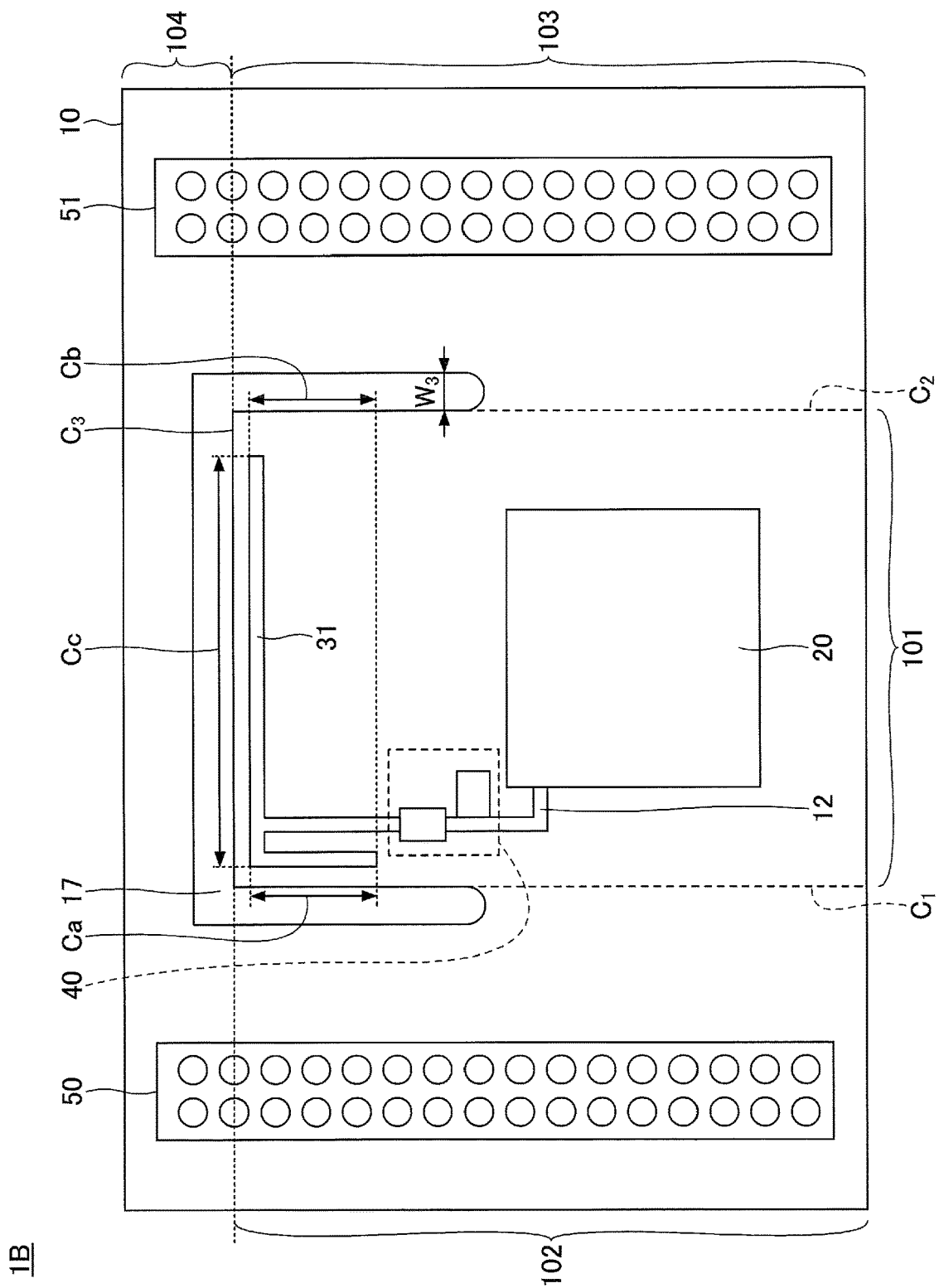
FIG. 6 is a plan view illustrating an example of a semiconductor apparatus according to a second variation of the first embodiment.

FIG. 6 is a plan view illustrating an example of a semiconductor apparatus according to a second variation of the first embodiment. In FIG. 6, a semiconductor apparatus 1B differs from the semiconductor apparatus 1A (see FIG. 5) in that the interconnect substrate 10 has an evaluation region 104 which is situated at an edge of the antenna module region 101 and which connects the evaluation region 102 and the evaluation region 103.

A boundary line $C_3$ is an imaginary line separating the antenna module region 101 from the evaluation region 104, and a line extending from boundary line $C_3$ is indicated by a dotted line for the sake of convenience. In the example illustrated in FIG. 6, a slit 17 is formed along the entire extension of the boundary line $C_3$. The edge of the antenna module region 101 situated toward the evaluation region 104 corresponds to the boundary line $C_3$.

The semiconductor apparatus 1B having the configuration illustrated in FIG. 6 is shipped from the factory. The interconnect substrate 10 is then cut along the boundary lines $C_1$, $C_2$, and $C_3$ to remove the evaluation regions 102, 103, and 104 from the interconnect substrate 10, thereby allowing only the antenna module region 101 to be included in the finished product. Nonetheless, in the case in which the slit 17 is formed along the entire extension of the boundary line $C_3$ as in the example of FIG. 6, dicing along the boundary line $C_3$ is not necessary.

It may be noted that an evaluation circuit, which may be connected to the evaluation terminals and to the semiconductor integrated circuit 20, may be mounted in the evaluation region 104 according to need. In addition to the noted edge of the antenna module region 101, the opposite edge of the antenna module region 101 may also be configured such that the evaluation region 102 and the evaluation region 103 are connected to each other.

The interconnect substrate 10 has the slit 17 formed therein. The slit 17 is not formed inside the antenna module region 101, and is formed inside the evaluation regions 102, 103, and 104 alongside, and in contact with, the antenna Module region 101. Specifically, the slit 17 is formed in the evaluation regions 102, 103, and 104 such that the slit 17 includes at least the portion of the boundary line $C_1$ which is situated opposite the antenna 31. The portion of the boundary line $C_2$ which is situated opposite the antenna 31, and the portion of the boundary line $C_3$ which is situated opposite the antenna 31.

Notwithstanding this, the slit 17 may be formed to extend to both the antenna module region 101 and the evaluation region 102. Further, the slit 17 may be formed to extend to both the antenna module region 101 and the evaluation region 103. Further, the slit 17 may be formed to extend to both the antenna module region 101 and the evaluation region 104. Further, the slit 17 may be formed to extend to two or more of the antenna module region 101 and the evaluation regions 102, 103, and 104.

In the example illustrated in FIG. 6, the range indicated as Cc is the portion of the boundary line $C_3$ situated opposite the antenna 31. The slit 17 is formed in the evaluation regions 102, 103, and 104 such that the slit 17 includes at least the ranges indicated as Ca, Cb, and Cc. In the example illustrated in FIG. 6, the slit 17 is a single continuous slot having a U shape. Notwithstanding this, the slit 17 may be formed in a piecewise manner such as to include at least the ranges indicated as Ca, Cb, and Cc. The slit 17 is preferably longer than the ranges indicated by Ca, Cb, and Cc.

In this manner, the slit 17 has such a length that the slit 17 includes at least a portion, situated opposite the antenna 31, of the boundary line $C_1$ that separates the antenna module region 101 from the evaluation region 102, a portion, situated opposite the antenna 31, of the boundary line $C_2$ that separates the antenna module region 101 from the evaluation region 103, and a portion, situated opposite the antenna 31, of the boundary line $C_3$ that separates the antenna module region 101 from the evaluation region 104.

The width W3 of the slit 17 is preferably greater than or equal to 2 mm. Satisfying these conditions allows the matching characteristics existing before and after the removal of the evaluation regions 102, 103, and 104 to coincide with sufficient accuracy.

When the antenna 31 is situated closest to one of the evaluation regions 102, 103, and 104, and the antenna 31 is thus affected only by the physical property values of the closest one of the evaluation regions 102, 103, and 104, a slit may be provided only in the evaluation region that has such affecting physical property values.

Further, the present invention is not limited to these embodiments and variations, but various variations and modifications may be made without departing from the scope of the present invention.

With respect to a semiconductor apparatus having an evaluation region in addition to a region that will become a finished product, the disclosed technology allows proper characteristics evaluation to be performed, prior to the removal of the evaluation region, with respect to the region that will become a finished product.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor apparatus, comprising:
    a substrate having an upper surface;
    an antenna disposed on the upper surface of the substrate; and
    a semiconductor integrated circuit disposed on the upper surface of the substrate, the semiconductor integrated circuit being electrically connected to the antenna,
    wherein the upper surface of the substrate includes an antenna module region and at least one evaluation region, the antenna module region having both the antenna and the semiconductor integrated circuit disposed therein, the at least one evaluation region being situated next to the antenna module region and having terminals for connection to an external device used to evaluate characteristics of the antenna,
    wherein the substrate has at least one slit formed therethrough in the at least one evaluation region such that the slit includes at least a portion, situated opposite the antenna, of a boundary line that separates the antenna module region and the evaluation region from each other.

2. The semiconductor apparatus as claimed in claim 1, wherein the at least one evaluation region includes a first evaluation region and a second evaluation region that are situated opposite each other across the antenna module region, and
    wherein the at least one slit includes a first slit that includes at least a portion, situated opposite the antenna, of a boundary line that separates the antenna module region and the first evaluation region from each other, and includes a second slit that includes at least a portion, situated opposite the antenna, of a boundary line that separates the antenna module region and the second evaluation region from each other.

3. The semiconductor apparatus as claimed in claim 1, wherein the at least one evaluation region includes a first evaluation region, a second evaluation region, and a third evaluation region, the first evaluation region and the second evaluation region being situated opposite each other across the antenna module region, the third evaluation region being situated at one edge of the antenna module region and connecting the first evaluation region and the second evaluation region, and
    wherein the at least one slit includes a first slit portion, a second slit portion, and a third slit portion, the first slit portion being situated on a boundary line that separates the antenna module region from the first evaluation region, the second slit portion being situated on a boundary line that separates the antenna module region from the second evaluation region, the third slit portion being situated on a boundary line that separates the antenna module region from the third evaluation region.

4. The semiconductor apparatus as claimed in claim 3, wherein the first slit portion, the second slit portion, and the third slit portion are continuous and connected together as a single piece.

5. The semiconductor apparatus as claimed in claim 1, wherein a width of the slit is preferably greater than or equal to 2 mm.

6. The semiconductor apparatus as claimed in claim 1, wherein the slit is disposed only in the evaluation region.

7. The semiconductor apparatus as claimed in claim 1, wherein the slit is formed to extend to both the antenna module region and the evaluation region.

8. The semiconductor apparatus as claimed in claim 1, wherein the at least one slit has such a length that the slit includes at least the portion, situated opposite the antenna, of the boundary line that separates the antenna module region and the evaluation region from each other.

* * * * *